US012742825B2

(12) United States Patent
Shibata

(10) Patent No.: US 12,742,825 B2
(45) Date of Patent: Sep. 22, 2026

(54) POWER SUPPLY CIRCUIT, VOLTAGE MONITORING CIRCUIT, AND POWER SUPPLY DEVICE

(71) Applicant: Kohei Shibata, Isehara (JP)

(72) Inventor: Kohei Shibata, Isehara (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 217 days.

(21) Appl. No.: 18/645,445

(22) Filed: Apr. 25, 2024

(65) Prior Publication Data

US 2024/0361390 A1 Oct. 31, 2024

(30) Foreign Application Priority Data

Apr. 27, 2023 (JP) ................................ 2023-072921

(51) Int. Cl.
*G01R 31/38* (2006.01)
*G01R 31/3835* (2019.01)

(52) U.S. Cl.
CPC ................................ *G01R 31/3835* (2019.01)

(58) Field of Classification Search
CPC .......... G01R 19/16542; G01R 31/3835; G01R 31/396; G01R 31/3842; G01R 31/382; G01R 31/36; G01R 31/392; G01R 31/385; G01R 31/388; G01R 31/364; G01R 31/3647; G01R 31/3832; G01R 31/387; G01R 21/06; Y02E 60/10; H02J 7/005; H02J 7/0013; H02J 7/0019; H02J 7/0047; H02J 7/0031; H02J 7/007194; H02J 2310/48; H02J 7/00308; H02J 3/32; H01M 10/48; H01M 2010/4271; H01M 10/4207; H01M 2220/20; H01M 2220/30; H01M 10/488; H01M 8/04559; H01M 8/04589; H01M 8/04619; H01M 8/04679
See application file for complete search history.

(56) References Cited

U.S. PATENT DOCUMENTS 5,631,603 A 5/1997 Stubbe
8,860,423 B2 * 10/2014 Miyamoto ......... G01R 31/3835 324/433

(Continued)

FOREIGN PATENT DOCUMENTS

| | | |
|---|---|---|
| JP | 2010-019810 A | 1/2010 |
| JP | 2013-015334 A | 1/2013 |
| WO | 2013001682 A1 | 2/2015 |

*Primary Examiner* — Vinh P Nguyen
(74) *Attorney, Agent, or Firm* — Shih IP Law Group, PLLC.

(57) ABSTRACT

Disclosed is a power supply monitoring circuit including: a first terminal to which a first voltage as a highest voltage of a battery including cells is connected; a second terminal to which a second voltage as a lowest voltage of the battery is connected; a selection circuit that selects a high potential and a low potential of a cell; an analog-to-digital conversion circuit to which the high and low potentials are input; a power supply circuit that generates an operating voltage of the analog-to-digital conversion circuit; and a logic circuit that receives a signal from the analog-to-digital conversion circuit, processes the signal, and outputs a signal from a third terminal to an external device. The operating voltage is a first operating voltage with a midpoint of the high potential and the low potential as a reference.

13 Claims, 5 Drawing Sheets

(56) References Cited

U.S. PATENT DOCUMENTS

| | | | | |
|---|---|---|---|---|
| 8,957,686 | B2 * | 2/2015 | Ueda | G01R 31/396 324/426 |
| 9,400,312 | B2 * | 7/2016 | Bosch | G01R 31/396 |
| 9,921,270 | B2 * | 3/2018 | Butzmann | H01M 10/482 |
| 10,094,863 | B2 | 10/2018 | Bahl | |
| 10,193,194 | B2 * | 1/2019 | Nakatsuka | H01M 10/441 |
| 12,313,690 | B2 * | 5/2025 | Fechalos | G01R 31/389 |
| 2010/0007351 | A1 | 1/2010 | Kurose | |
| 2014/0009143 | A1 | 1/2014 | Blagojevic | |

* cited by examiner

Signal Level
V_n
VA
V_n−1 (HIGH POTENTIAL)
V_n−2 (LOW POTENTIAL)
VB
V_4
V_3
V_2
V_1
V_0 (VSS)
Vcell_n−1
Vr1=Vr2
Vr2
V1
VDD_ADC
Vr5=Vr4+Vr3
(V_n− 1+V_n −2)/2
Vr4
Vr3
Vref
Vcom
ADC OUTPUT SIGNAL
LEVEL SHIFT + NOISE REMOVAL
DIGITAL LEVEL SHIFTER OUTPUT SIGNAL Signal Level
V_n
V_n-1
V_n-2
VA
V_4
(HIGH POTENTIAL)
V_3
(LOW POTENTIAL)
VB
V_2
V_1
V_0
(VSS)
Vcell_4
Vr1=Vr2
Vr2
V1
VDD_ADC
Vr5=Vr4+Vr3
(V_4+V_3)/2
Vr4
Vref
Vr3
Vcom
ADC OUTPUT SIGNAL
LEVEL SHIFT + NOISE REMOVAL
DIGITAL LEVEL SHIFTER OUTPUT SIGNAL

POWER SUPPLY CIRCUIT, VOLTAGE MONITORING CIRCUIT, AND POWER SUPPLY DEVICE

REFERENCE TO RELATED APPLICATIONS

This application is based upon and claims benefit of priority from the prior Japanese Patent Application No. 2023-072921, filed on Apr. 27, 2023, the entire contents of which are incorporated herein by reference.

TECHNICAL FIELD

The present disclosure relates to a circuit for power supply and a power supply device, and relates to a technology that is effective for use in a power supply circuit, and a voltage monitoring circuit and a power supply device having the power supply circuit, the power supply circuit serving as a device that generates a voltage used in an analog-to-digital conversion circuit (hereinafter sometimes referred to as "ADC") from the voltage of a battery in which a plurality of battery cells (hereinafter referred to as "cells") are connected in series, for example.

DESCRIPTION OF RELATED ART

In recent years, lithium-ion batteries have been used as rechargeable batteries in digital cameras and other portable equipment as batteries. Since the batteries continue to discharge when the equipment is in use, they may run out of remaining battery power during use and suddenly stop. In addition, if overcharging occurs, the rechargeable battery may become hot and rupture or catch fire.

Therefore, it is important to accurately measure the battery level. To accurately measure the battery level, a method of digitally processing the measured battery voltage has been proposed (for example, WO 2013/001682). In this case, an ADC is needed to convert analog data to digital.

Here, an operating voltage must be supplied to the ADC in order for the ADC to operate. For circuit simplification, the operating voltage of the ADC is often the voltage of a rechargeable battery. In the case of a rechargeable battery with multiple cells connected in series, the voltage of the cell located on the high potential side may be measured. At this time, since the potential difference between the potential of the cell on the high potential side and the ground voltage exceeds the operable voltage of the ADC, a level shift circuit is required to correct the voltage of the rechargeable battery to the operating voltage of the ADC according to the cell to be measured (for example, JP 2010-019810 A).

However, in order to correct the potential of the cell on the high potential side with the ground voltage as a reference to within the range of the ADC's operating voltage, multiple capacitors to temporarily hold the cell voltage, multiple switch circuits, and a control circuit to drive the switch circuits are required, making the circuit complex.

SUMMARY OF THE INVENTION

An object of the present disclosure is to generate the operating voltage of an ADC with the midpoint of the high and low potentials of the cell to be measured as a reference, and as a result, to provide a power supply circuit that can generate the operating voltage of the ADC with a simple circuit, and a voltage monitoring circuit and power supply device having the power supply circuit.

To achieve at least one of the abovementioned objects, according to an aspect of the present disclosure, there is provided a power supply monitoring circuit including: a first terminal to which a first voltage that is a highest voltage of a battery including a number of cells is connected, the number being an integer greater than or equal to two; a second terminal to which a second voltage that is a lowest voltage of the battery is connected; a selection circuit that selects a high potential and a low potential of a cell which is one of the number of cells; an analog-to-digital conversion circuit to which the high potential and the low potential are input; a power supply circuit that generates an operating voltage of the analog-to-digital conversion circuit; and a logic circuit that receives a signal from the analog-to-digital conversion circuit, processes the signal, and outputs a signal from a third terminal to an external device, wherein the operating voltage is a first operating voltage with a midpoint of the high potential and the low potential as a reference.

BRIEF DESCRIPTION OF DRAWINGS

The accompanying drawings are not intended as a definition of the limits of the invention but illustrate embodiments of the invention, and together with the general description given above and the detailed description of the embodiments given below, serve to explain the principles of the invention, wherein.

DETAILED DESCRIPTION

Hereinafter, one or more suitable embodiments of the present disclosure will be described with reference to the drawings. However, the scope of the present disclosure is not limited to the disclosed embodiments.

Figure 1:
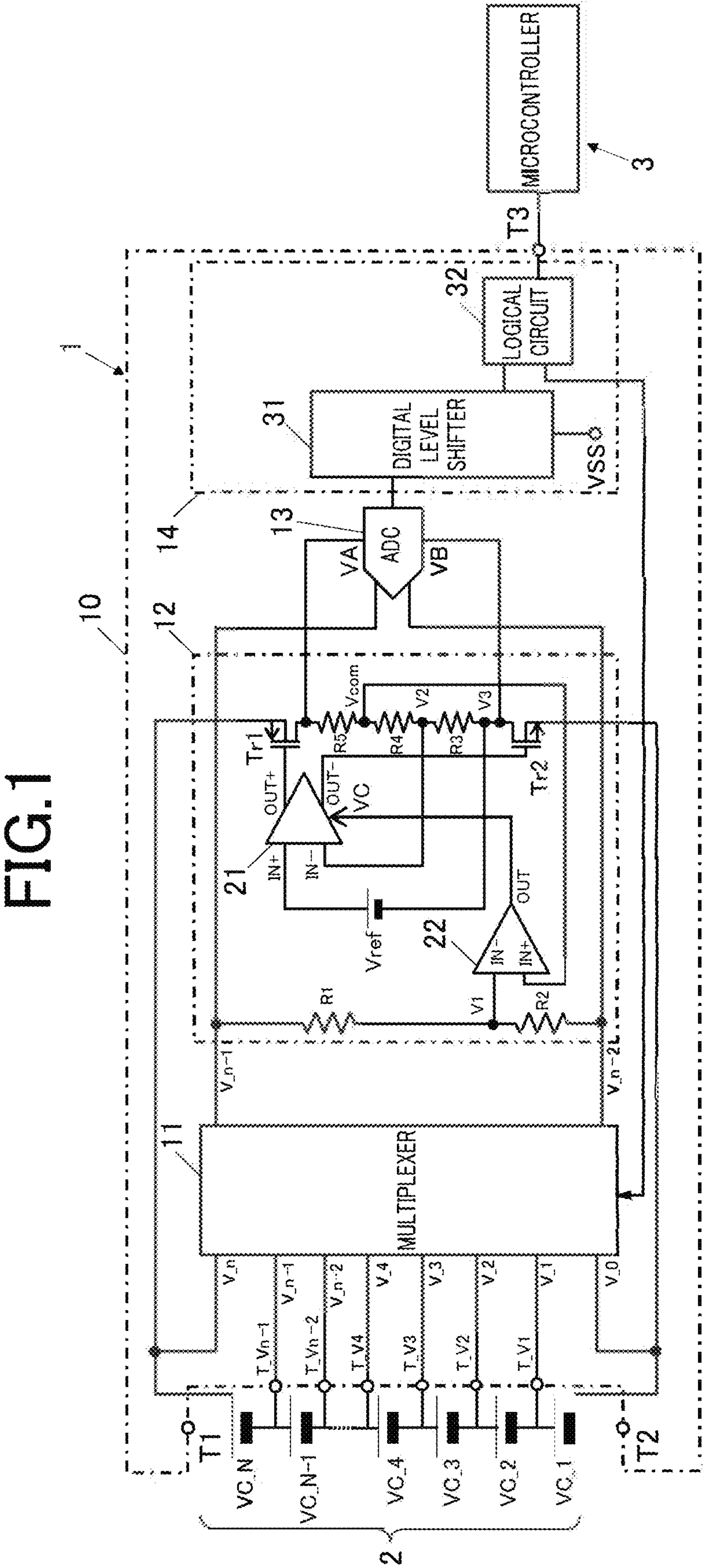
FIG. 1 is a circuit configuration diagram showing an example of a voltage monitoring circuit with an embodiment of a power supply circuit applying the present disclosure and a power supply device.
Figure 2:
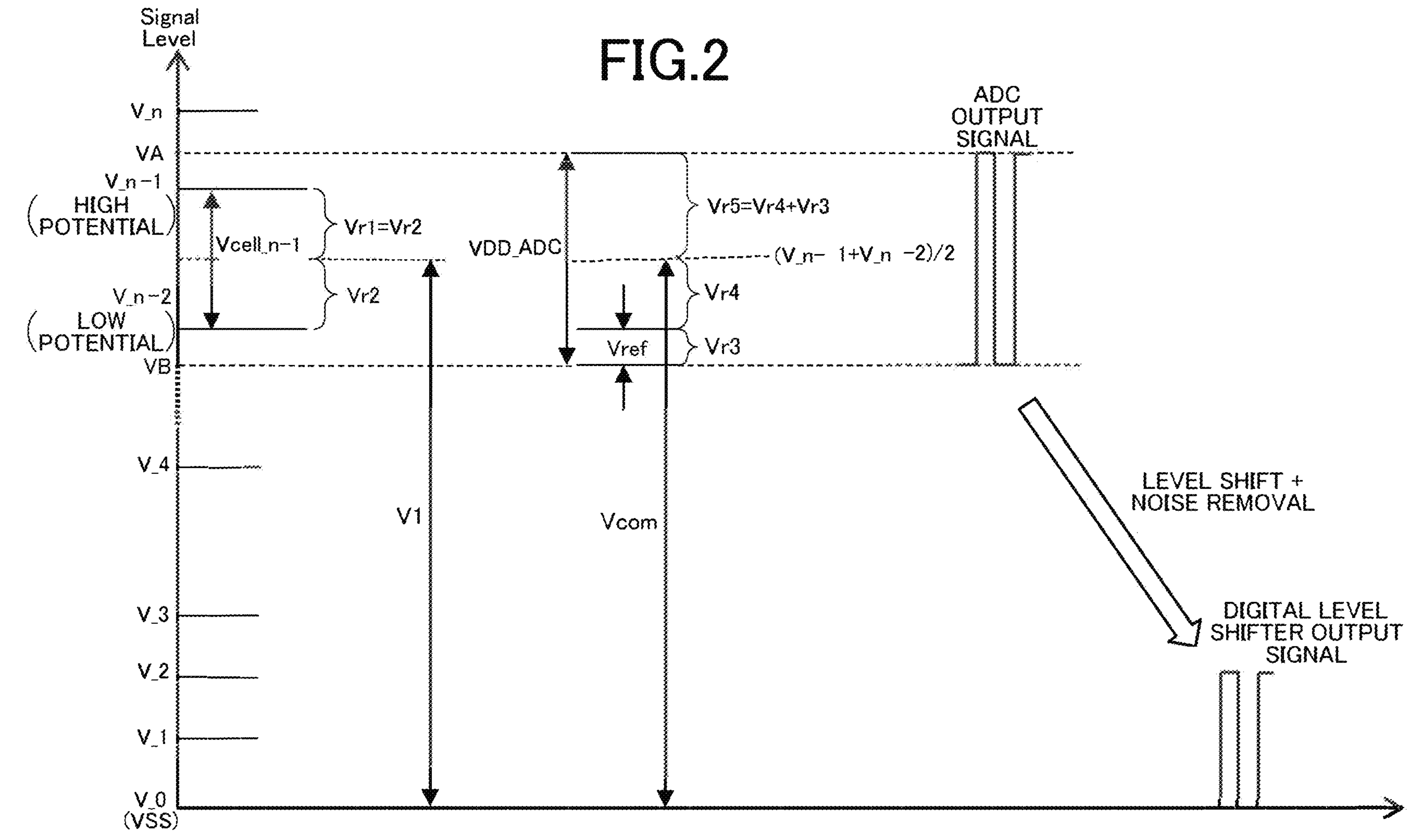
FIG. 2 shows an example of a power supply generation method in an embodiment of a power supply circuit applying the present disclosure.
Figure 3:
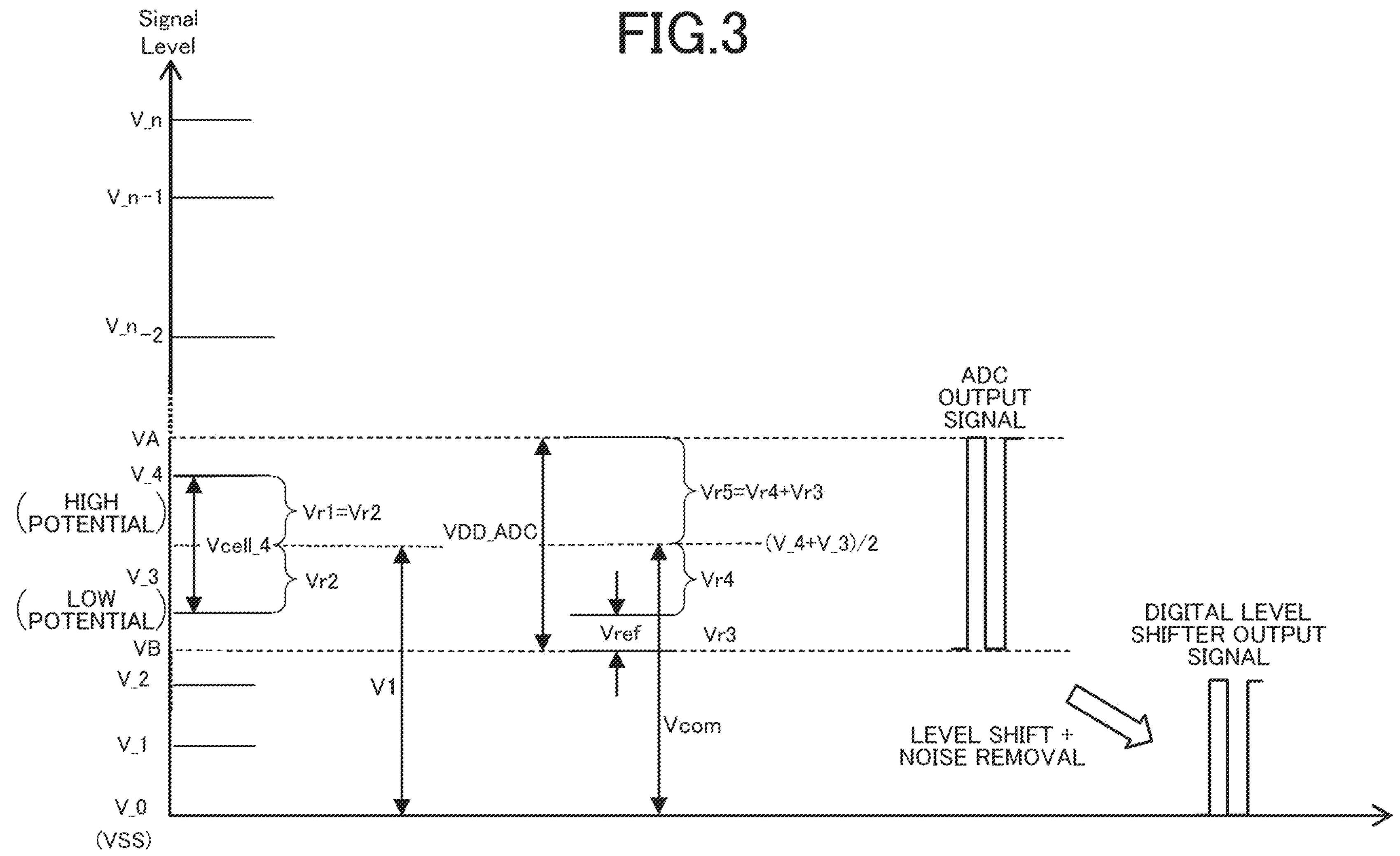
FIG. 3 shows another example of a power supply generation method in an embodiment of a power supply circuit applying the present disclosure.
Figure 4:
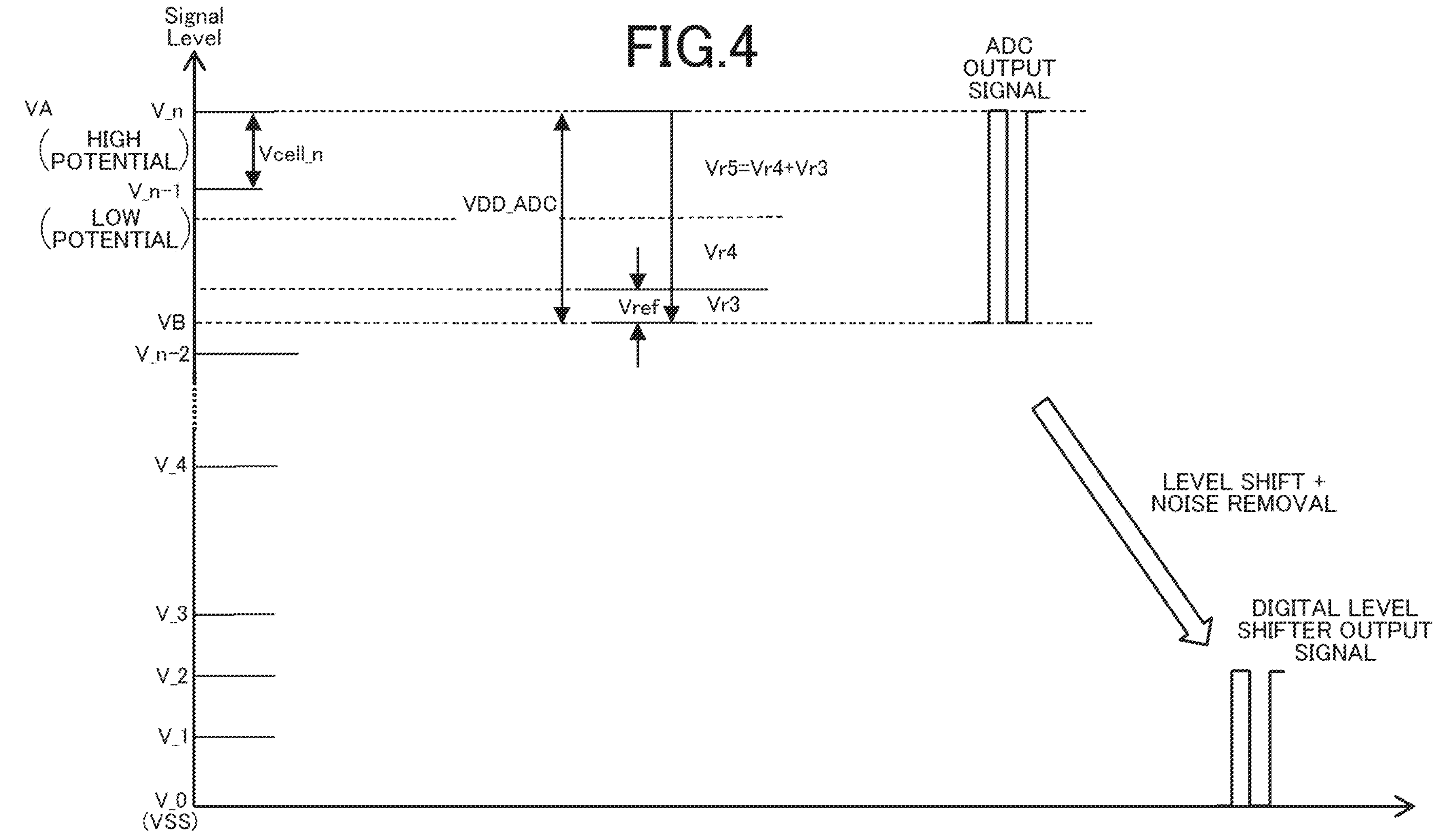
FIG. 4 shows further another example of a power supply generation method in an embodiment of a power supply circuit applying the present disclosure.
Figure 5:
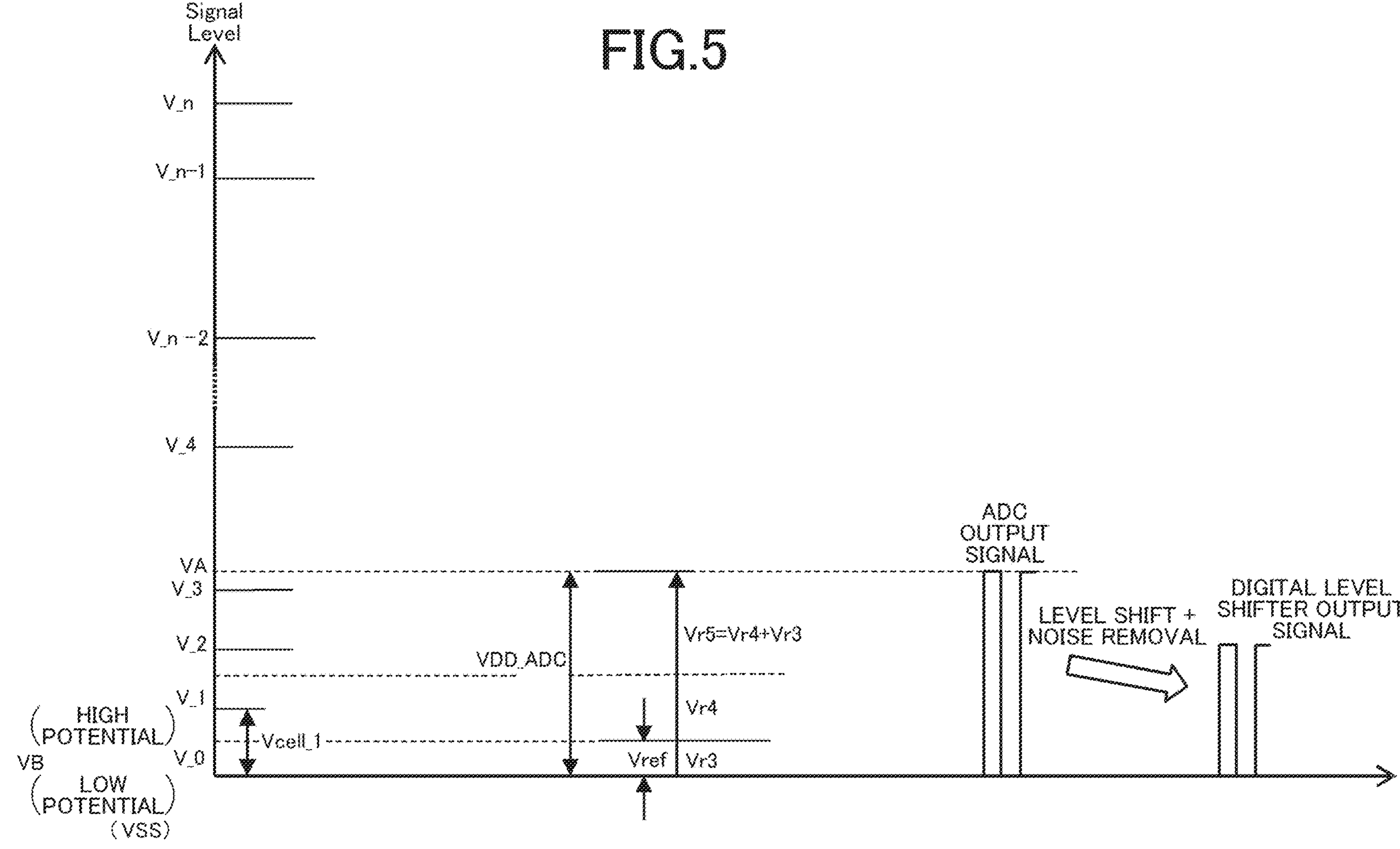
FIG. 5 shows further another example of a power supply generation method in an embodiment of a power supply circuit applying the present disclosure.

FIG. 1 is a circuit configuration diagram showing an example of a voltage monitoring circuit with an embodiment of a power supply circuit applying the present disclosure and a power supply device 1. As shown in FIG. 1, the power supply device 1 has a battery 2 with N (N is an integer of 2 or more) cells VC_N~VC_1 connected in series, a voltage monitoring circuit 10 and a microcontroller 3.

The battery 2 is a rechargeable battery that can be recharged, such as a lithium-ion battery. The voltage monitoring circuit 10 is capable of measuring the voltage of each cell of the battery 2. The voltage monitoring circuit 10 has a terminal T1 to which the high potential side of the battery 2 is connected and a terminal T2 to which the low potential side is connected. The terminal T2 may be connected to ground voltage (VSS). In order to enable measurement of the voltage of each cell VC_N~VC_1, there are terminals T_Vn-1~T_V1 that connect the high potential side and the low potential side of cells VC_N~VC_1, respectively. The high potential V_n terminal of cell VC_N, which is located on the highest potential side, can be a common terminal with the terminal T1. The terminal of low potential V_0 of cell VC_1, which is located on the lowest potential side, may be a common terminal with the terminal T2.

The voltage monitoring circuit 10 has a terminal T3 for data communication with the microcontroller 3. For example, the microcontroller 3 inputs commands through the terminal T3, and the logic circuit 14 specifies one of the cells VC_N to VC_1 corresponding to the command and monitors the voltage. The voltage monitoring circuit 10 can also output the measurement result of the voltage of the cell specified based on the microcontroller 3's command to the microcontroller 3 through the terminal T3. The microcontroller 3 is, for example, a battery management system, which can control the power supply device according to the cell voltages measured by the voltage monitoring circuit 10. In FIG. 1, there is one terminal T3 since serial communication is shown as an example, but for parallel communication, multiple terminals T3 may be arranged.

The voltage monitoring circuit 10 has a multiplexer 11, a power supply circuit 12, an ADC (analog-to-digital conversion circuit) 13, and a logic circuit 14. The multiplexer 11 is connected to the high and low potential sides of the respective cells. In other words, terminals T1, T2, and T_Vn-1~T_V1 of battery 2 are connected to the multiplexer 11. Under control of the logic circuit 14 and the like, the multiplexer 11 can select the high potential side or the low potential side of the cell to be measured. In other words, the multiplexer 11 functions as a selection circuit to select the cell to be measured.

Here, as an example, description is made for a case where the cell VC_N-1 is the target of measurement, and the high potential V_n-1 and the low potential V_n-2 of the cell VC_N-1 are selected. The high potential V_n-1 and the low potential V_n-2 selected by the multiplexer 11 are input to the power supply circuit 12. The power supply circuit 12 uses the high potential V_n-1 and the low potential V_n-2 to generate a voltage with the high potential V_n-1 and the low potential V_n-2 as the midpoint, and can supply this voltage to the ADC 13 as the operating voltage.

The power supply circuit 12 includes a first resistor circuit having resistors R1 and R2, a second resistor circuit having resistors R3, R4, and R5, a first transistor Tr1 and a second transistor Tr2 located at both ends of the second resistor circuit, a first differential amplifier 21, a second differential amplifier 22, and a reference voltage Vref.

The resistors R1 and R2 of the first resistor circuit are connected in series. The first resistor circuit is electrically connected to the high potential V_n-1 and the low potential V_n-2. Specifically, one end of the first resistor circuit is electrically connected to the high potential V_n-1, the other end of the first resistor circuit is electrically connected to the high potential V_n-1, and the resistors R1 and R2 are placed in order from the high potential V_n-1 side. Here, the connection point of the resistors R1 and R2 is a node V1.

The resistors R5, R4, and R3 of the second resistor circuit are connected in series. The second resistor circuit is electrically connected to the terminals T1 and T2. The resistors R3 to R5 are arranged in order from the high potential side (terminal T1 side): resistor R5, resistor R4, and resistor R3.

The first transistor Tr1 is located on the high potential side of the second resistor circuit, and the second resistor circuit is connected to the terminal T1 via the first transistor Tr1. The second transistor Tr2 is located on the low potential side of the second resistor circuit, and the second resistor circuit is connected to the terminal T2 via the second transistor Tr2. Here, the first transistor Tr1 is, for example, a P-type MOS transistor, and the drain side is connected to the resistor R5. The second transistor Tr2 is, for example, an N-type MOS transistor, and the drain side is connected to the resistor R3.

The connection point of the first transistor Tr1 and the resistor R5 is designated as a node VA. The connection point of the resistor R5 and the resistor R4 is designated as a node Vcom. The connection point of the resistor R4 and the resistor R3 is designated as a node V2. The low potential side of the resistor R3 is designated as a node V3. The connection point of the second transistor Tr2 and the resistor R3 is designated as a node VB. The node V3 is almost at the same potential as the node VB.

The first differential amplifier 21 is, for example, a fully differential amplifier, with two input terminals IN+ and IN−, two output terminals OUT+ and OUT−, and a terminal VC to which the voltage for setting the output common-mode voltage of a differential output voltage of the output terminals OUT+ and OUT− is input. The input terminal IN+ of the first differential amplifier 21 is connected to the node V3 via the reference voltage Vref. In other words, a voltage based on the potential of the node V3 is input to the input terminal IN+ of the first differential amplifier 21. The input terminal IN− of the first differential amplifier 21 is connected to the node V2. The output terminal OUT+ of the first differential amplifier 21 is connected to the gate of the first transistor Tr1, and the output terminal OUT− is connected to the gate of the second transistor Tr2.

The second differential amplifier 22 has two input terminals IN+ and IN− and one output terminal OUT. The input terminal IN− of the second differential amplifier 22 is connected to the node V1 of the first resistor circuit. The input terminal IN+ of the second differential amplifier 22 is connected to the node Vcom of the second resistor circuit. The output terminal OUT of the second differential amplifier 22 is connected to the terminal VC of the first differential amplifier 21. Here, the input terminals IN+ and IN− of the first differential amplifier 21 are imaginary shorted, so the potential difference Vr3 applied to both ends of the resistor R3 is equal to the reference voltage Vref. The second differential amplifier 22 works as a common mode feedback amplifier. The node V1 and the node Vcom are imaginary shorts, and the first and second differential amplifiers 21 and 22 operate to equalize the potential of node Vcom to the potential of node V1.

Hence, under the condition that the resistance values are resistors R1=R2 and R5=R4+R3, the first differential amplifier 21 controls the first transistor Tr1 and the second transistor Tr2, and the operating voltage with the midpoint of the high potential V_n-1 and low potential V_n-2 of the cell VCn-1 as a reference is output from the second resistance circuit to the ADC 13. The width of the operating voltage supplied to the ADC 13 (difference between the nodes VA and VB) can be set by the reference voltage Vref and the resistance values of the resistors R3 and R4.

The high potential V_n-1 and the low potential V_n-2 selected by the multiplexer 11 are input to the input terminal of the ADC 13, and the difference between the high potential V_n-1 and the low potential V_n-2 is output as a digital signal to the logic circuit 14. This digital signal becomes the voltage information of cell VC_N-1, and the battery level of cell VC_N-1 is calculated using this voltage information.

The potential of the node VA is supplied to the high potential side and the potential of the node VB is supplied to the low potential side as the operating voltage of the ADC 13. Therefore, the output digital signal is a digital signal with the potential of the node VB as a reference.

The logic circuit 14 has a digital level shifter 31 and a logical circuit 32. The arithmetic processing of the logical circuit 32 is performed with VSS reference digital data whose low level is VSS (=0V) in consideration of the processing of digital signals output from other circuits such as clock signals and output to the microcontroller 3. However, the low level of the digital signal output from the ADC 13 is a level with the potential of the node VB as a reference, so the potential of VSS may not be the reference. Therefore, the digital signal output from the ADC 13 is input to digital level shifter 31. Here, the digital level shifter 31 corrects the voltage reference of the digital signal so that it becomes the VSS reference.

Here, as a comparative example, the operating voltage of the ADC 13 is changed to the VSS reference by analog level shifting, which requires a complex circuit to temporarily hold the cell voltage, and then digital conversion is performed so that the ADC 13 outputs a VSS reference digital signal, assuming a circuit that inputs digital signals to the logical circuit 32 without using a digital level shifter. On the other hand, the present disclosure changes the voltage reference of the digital signal to the VSS reference with the digital level shifter 31 after the operating voltage of the ADC 13 is generated by a simple circuit and digital conversion is performed by the ADC 13. In other words, compared to the comparative example, the present disclosure does not require a complex circuit to temporarily hold the cell voltage. Therefore, the analog circuit that performs processing prior to the digital conversion of the ADC 13 is simpler, and the number of noise-sensitive analog circuit elements can be reduced. As a result, error factors caused by circuit elements can be reduced, and the present disclosure can improve the accuracy of the measured voltage compared to the comparative example.

The digital signal (voltage value of cell VC_N-1) whose voltage reference is corrected by the digital level shifter 31 is input to the logical circuit 32. The logical circuit 32 then performs data processing such as parallel-to-serial conversion for serial communication and adding cell position information at an appropriate time, and outputs the voltage value of cell VC_N from the terminal T3 to the microcontroller 3.

Next, an example of a power supply generation method for a power supply circuit applying the present disclosure is described using FIGS. 2 to 5.

Here, the battery 2 is usually required to have a high voltage, which exceeds the operable voltage of the ADC 13. For example, if the voltage of the battery 2 is 14 V and the operable voltage of the ADC 13 is 5 V, the potential difference between the node VA and the node VB must be within 5 V no matter which cell voltage is selected for measurement from the cells VC_N~VC_1 that the battery 2 has.

Therefore, the numerical values for each resistance and voltage in the power supply circuit 12 are set as shown below. Note that the numerical values shown below are examples and include all values based on a concept of the present disclosure. Although voltage drops may occur due to the on-resistance of the first and second transistors, the voltage drops due to the on-resistance of the first and second transistors shall not be considered for the sake of clarity of calculation concept.

Condition A: Reference voltage Vref=1.0V

Condition B: Ratio of resistance values of resistor R1 and resistor R2, R1:R2=1:1

Condition C: Ratio of resistance values of resistor R5, resistor R4 and resistor R3, R5:R4:R3=5:3:2

The potential difference between both ends of resistor R3 is Vr3 (=V2−V3), potential difference between both ends of resistor R4 is Vr4 (=Vcom−V2), the potential difference between both ends of resistor R5 is Vr5 (=VA−Vcom), and the operating voltage of the ADC 13 is VDD_ADC (=VA−VB).

<Case 1 (FIG. 2): Measurement cell VC_N-1, high potential V_n-1=12.0V, low potential V_n-2=8.0V>

The first differential amplifier 21 is a fully differential amplifier, and the input terminals IN+ and IN− are imaginary shorted, the potential difference Vr3 applied to both ends of the resistor R3 is equal to the reference voltage Vref, so Vr3=V2−V3=Vref=1.0V . . . (1-1). The potential difference Vr4+Vr3 between the high potential side of the resistor R4 and the low potential side of the resistor R3 is Vr4+Vr3=Vr3*(R4+R3)/R3=1.0*(3+2)/2=2.5V . . . (1-2) from the result of equation (1-1) and the resistance ratio of the resistors R4 and R3. The potential difference Vr5 applied to both ends of the resistor R5 is Vr5=Vr3*R5/R3=1.0*(5/2)=2.5V . . . (1-3) from the result of equation (1-1) and the resistance ratio of the resistors R5 and R3. Also, by making the resistance values of the resistors R1 and R2 equal, the potential of node V1 can be set to the midpoint of high potential V_n-1 and low potential V_n-2. V1=(V_n-1−V_n-2)*R1/(R1+R2)+V_n-1=(12.0−8.0)*1/(1+1)+8.0=10.0V . . . (1-4)

Since the second differential amplifier 22 works as a common mode feedback amplifier, the node V1 and the node Vcom are imaginary shorted and the first differential amplifier 21 operates to make the voltage of the node Vcom equal to the node V1, so Vcom=V1=10.0V . . . (1-5). From the result of equations (1-1) to (1-5), the node VA and the node VB are as follows.

$$VA = Vcom + Vr5 = 10.0\text{ V} + 2.5\text{ V} = 12.5\text{ V} \quad (1\text{-}6)$$

$$VB = Vcom - (Vr4 + Vr3) = 10.0\text{ V} - 2.5\text{ V} = 7.5\text{ V} \quad (1\text{-}7)$$

The operating voltage VDD_ADC input to the ADC 13 is the potential difference between the node VA and the node VB, $$\text{VDD\_ADC} = VA - VB = 5.0\text{ V}. \quad (1\text{-}8)$$

Thus, the power supply circuit 12 can output 10 V, the midpoint between the high and low potentials of cell VC_N-1, as the operating voltage VDD_ADC. The reference voltage Vref is the multiplier that determines the width of the operating voltage VDD_ADC (difference between the highest and lowest potentials). The width of the operating voltage VDD_ADC can be changed by changing the resistance ratio of resistors R5 to R3. For example, if R5:R4:R3=2:1:1, the result of equations (1-2) and (1-3) is 2.0 V, respectively, and the width of VDD_ADC is 4.0 V.

The voltage value Vcell_N-1 of the cell VC_N-1 is converted to a digital signal by the ADC 13. This digital signal is converted to a digital signal whose low level is VSS (=0V) reference by the digital level shifter 31. At this time, the digital level shifter 31 can also work noise removal, such as excluding obviously abnormal data, or change the width of the digital signal (difference between the high and low levels).

<Case 2 (FIG. 3): Measurement cell VC_4, high potential V_4=6.0 V, low potential V_3=4.0 V>

Since the same circuit as in Case 1 is used for measurement, conditions A to C are the same as in Case 1. The first differential amplifier 21 is a fully differential amplifier, input terminals IN+ and IN− are imaginary shorted, and the potential difference Vr3 applied to both ends of the resistor R3 is equal to the reference voltage Vref, so Vr3=V2−V3=Vref=1.0V . . . (2-1). The potential difference Vr4+Vr3 between the high potential side of the resistor R2 and the low potential side of the resistor R3 is Vr4+Vr3=Vr3*(R4+R3)/R3=1.0*(3+2)/2=2.5V . . . (2-2) from the result of equation (2-1) and the resistance ratio of the resistors R4 and R3.

The potential difference Vr5 applied to both ends of the resistor R5 is Vr5=Vr3*R5/R3=1.0*(5/2)=2.5V . . . (2-3) from the result of equation (2-1) and the resistance ratio of the resistors R5 and R3. By equalizing the resistance values of the resistors R1 and R2, the potential of the node V1 can be set to the midpoint of high potential V_4 and low potential V_3.

$$V1 = (V\_4 - V\_3) * R1/(R1 + R2) + V\_3 = (6.0 - 4.0) * 1/(1 + 1) + 4.0 = 5.0\ \mathrm{V} \tag{2-4}$$

Also, the second differential amplifier 22 works as a common mode feedback amplifier, so the node V1 and the node Vcom are imaginary shorted and the first differential amplifier 21 operates to make the voltage of the node Vcom equal to node V1, so Vcom=V1=5.0V . . . (2-5). From the results of equations (2-1) to (2-5), the node VA and the node VB are as follows.

$$VA = Vcom + Vr5 = 5.0\ \mathrm{V} + 2.5\ \mathrm{V} = 7.5\ \mathrm{V} \tag{2-6}$$

$$VB = Vcom - (Vr4 + Vr3) = 5.0\ \mathrm{V} - 2.5\ \mathrm{V} = 2.5\ \mathrm{V} \tag{2-7}$$

The operating voltage VDD_ADC input to the ADC 13 is the potential difference between the node VA and the node VB, $$\mathrm{VDD\_ADC} = VA - VB = 5.0\ \mathrm{V} \tag{2-8}$$

Thus, the power supply circuit 12 can output 5.0 V, the midpoint between the high and low potentials of cell VC_4, as the operating voltage VDD_ADC. The reference voltage Vref is the multiplier that determines the width of the operating voltage VDD_ADC (difference between the highest and lowest potentials). The width of the operating voltage VDD_ADC can be changed by changing the resistance ratio of the resistors R5 to R3. For example, if R5:R4:R3=2:1:1, the result of equations (2-2) and (2-3) is 2.0 V, respectively, and the width of VDD_ADC is 4.0 V.

The voltage value Vcell_4 of the cell VC_4 is converted to a digital signal by the ADC 13. This digital signal is converted to a digital signal whose low level is VSS (=0V) by the digital level shifter 31. At this time, the digital level shifter 31 can also work noise removal, such as excluding obviously abnormal data, or change the width of the digital signal (difference between the high and low levels).

Thus, when measuring the voltage of the cell VC_4 on the lower potential side than cell VC_N-1, the power supply circuit 12 can bring the operating voltage VDD_ADC within the operable range of the ADC 13 under the same conditions A to C as in Case 1.

<Case 3 (FIG. 4): Measurement cell VC_N, high potential V_n=14.0V, low potential V_n-1=12.0V>

Since the same circuit as in Cases 1 and 2 is used for measurement, conditions A through C are the same as in Cases 1 and 2. Since the maximum potential of the battery 2 is 14.0 V, the upper limit of the operating voltage supplied to the ADC 13 is 14.0 V. Therefore, the reference of the operating voltage output from the power supply circuit 12 is not the midpoint of the high potential V_n and low potential V_n-1 of the measurement cell VC_N. The first differential amplifier 21 is a fully differential amplifier, input terminals IN+ and IN− are imaginary shorted, the potential difference Vr3 applied to both ends of resistor R3 is equal to the reference voltage Vref, so Vr3=V2−V3=Vref=1.0V . . . (3-1).

The potential difference Vr4+Vr3 between the high potential side of the resistor R2 and the low potential side of the resistor R3 is Vr4+Vr3=Vr3*(R4+R3)/R3=1.0*(3+2)/2=2.5V . . . (3-2) from the result of equation (3-1) and the resistance ratio of the resistors R4 and R3. The potential difference Vr5 applied to both ends of the resistor R5 is Vr5=Vr3*R5/R3=1.0*(5/2)=2.5V . . . (3-3) from the result of equation (3-1) and the resistance ratio of the resistors R5 and R3. The node V1 is V1=(V_n−V_n-1)*R1/(R1+R2)+Vn-1=(14.0−12.0)*1/(1+1)+12.0=13.0V . . . (3-4).

In addition, because the second differential amplifier 22 works as a common mode feedback amplifier, the node V1 and the node Vcom are imaginary shorted, and the first differential amplifier 21 operates to make the voltage of the node Vcom equal to the node V1, so Vcom=V1=13.0V . . . (3-5). From the results of equations (3-3) to (3-5), the node VA becomes equation (3-6) if the second differential amplifier 22 operates as a common feedback amplifier: VA=Vcom+Vr5=13.0V+2.5V=15.5V . . . (3-6)

However, since the maximum potential supplied from the battery 2 is 14.0 V, the node VA is not higher than 14.0 V. In other words, the second differential amplifier 22 does not function as a common feedback amplifier, and the first differential amplifier 21 controls the first transistor Tr1 to output the maximum potential supplied from the battery 2 to the node VA, and controls the second transistor Tr2 to make the node VB have a specified potential difference with respect to the node VA. As a result, the node VA becomes V_n=14.0V, the maximum potential supplied from the battery 2, as shown in equation (3-7).

$$VA = V\_n = 14.0\ \mathrm{V} \tag{3-7}$$

Since the second differential amplifier 22 does not function as a common feedback amplifier, the node VB becomes VB=VA−(Vr5+Vr4+Vr3)=14.0V−5.0V=9.0V . . . (3-8) from equations (3-2) and (3-3). The operating voltage VDD_ADC input to the ADC 13 is 14.0V and 9.0V, and the operating voltage VDD_ADC supplied to the ADC 13 is the potential difference between the node VA and the node VB, VDD_ADC=VA−VB=5.0V . . . (3-9).

Thus, when the cell selected by the multiplexer 11 is the cell VC_N on the highest potential side of the battery 2, the power supply circuit 12 cannot set the reference of the operating voltage supplied to the ADC 13 to 13.0 V, the midpoint of the high and low potentials of the cell VC_N.

However, the power supply circuit 12 can output the high potential of the cell VC_N as the high potential of the operating voltage VDD_ADC from the node VA. In addition, the power supply circuit 12 can output the potential considering the voltage drop of the resistors R3 to R5 from the node VA as the low potential of the operating voltage VDD_ADC from the node VB.

As a result, 5.0 V can be supplied to the ADC 13 as the operating voltage VDD_ADC. Here, the width of the operating voltage VDD_ADC, which is the potential difference that determines the high and low of the digital signal waveform, can be 5.0 V, the same as Case 1 and Case 2.

Even if the selected cell is not the highest potential side cell VC_N, if the equation (3-10) is satisfied, the power supply circuit 12 generates the voltage from equation (3-7) to equation (3-9).

$$Vcom + Vr5 > \mathrm{V\_n}\ (N \text{ is an integer}) \tag{3-10}$$

In addition, the reference voltage Vref is the multiplier that determines the width of the operating voltage VDD_ADC (the difference between the highest and lowest potentials). The width of the operating voltage VDD_ADC can be changed by changing the resistance ratio of the resistors R5 to R3. For example, if R5:R4:R3=2:1:1, the result of equations (3-2) and (3-3) is 2.0 V, respectively, and the width of VDD_ADC is 4.0 V.

The voltage value Vcell_n of the cell VC_N is converted to a digital signal by the ADC 13. This digital signal is converted to a digital signal whose low level is VSS (=0V) by the digital level shifter 31. At this time, the digital level shifter 31 can also work noise removal, such as excluding obviously abnormal data, or change the width of the digital signal (difference between the high and low levels).

Thus, even when the cell VC_N on the highest potential side is selected, the power supply circuit 12 can bring the operating voltage VDD_ADC within the operable range of the ADC 13 under the same conditions A to C as in Cases 1 and 2.

<Case 4 (FIG. 5): Measurement cell VC_1, high potential V_1=2.0 V, low potential V_0=0 V>

Since the same circuit as Cases 1 to 3 is used for measurement, conditions A to C are the same as Cases 1 to 3. Since the lowest potential of the battery 2 is 0V, the lower limit of the operating voltage supplied to the ADC 13 is 0V. Therefore, the operating voltage output from the power supply circuit 12 may not be the midpoint between the high potential V_1 and low potential V_0 of the measurement cell VC_1.

The first differential amplifier 21 is a fully differential amplifier, the input terminals IN+ and IN− are imaginary shorted, the potential difference Vr3 applied to both ends of the resistor R3 is equal to the reference voltage Vref, so Vr3=V2−V3=Vref=1.0V . . . (4-1). The potential difference Vr4+Vr3 between the high potential side of the resistor R4 and the low potential side of the resistor R3 is Vr4+Vr3=Vr3*(R4+R3)/R3=1.0*(3+2)/2=2.5V . . . (4-2) from the result of equation (4-1) and the resistance ratio of the resistors R4 and R3.

The potential difference Vr5 applied to both ends of the resistor R5 is Vr5=Vr3*R5/R3=1.0*(5/2)=2.5V . . . (4-3) from the result of equation (4-1) and the resistance ratio of the resistors R5 and R3. The node V1 is V1=(V_1−V_0)*R1/(R1+R2)+V_0=(2.0−0.0)*1/(1+1)+0=1.0V . . . (4-4).

Since the second differential amplifier 22 works as a common mode feedback amplifier, the node V1 and the node Vcom are imaginary shorted and the first differential amplifier 21 operates to make the voltage of the node Vcom equal to the node V1, so Vcom=V1=1.0V . . . (4-5). From the results of equations (4-3) to (4-5), the node VB becomes equation (4-6) if the second differential amplifier 22 operates as a common feedback amplifier: VB=Vcom−(Vr4+Vr3)=1.0V−2.5V=−1.5V . . . (4-6)

However, since the lowest potential supplied from the battery 2 is 0 V, the node VB does not fall below 0 V. In other words, the second differential amplifier 22 does not function as a common feedback amplifier, and the first differential amplifier 21 controls the second transistor Tr2 to output the lowest potential supplied from the battery 2 to the node VB, and controls the first transistor Tr1 to make the node VA have the specified potential difference with respect to the node VB. As a result, the node VB becomes V_0=0V, the lowest potential supplied from battery 2, as shown in equation (4-7):

$$VB = \mathrm{V\_0} = 0\,\mathrm{V} \tag{4-7}$$

Since the second differential amplifier 22 does not function as a common feedback amplifier, the node VA becomes VA=VB+(Vr5+Vr4+Vr3)=0V+5.0V=5.0V . . . (4-8) from equations (4-2) and (4-3). The operating voltage VDD_ADC input to the ADC 13 is 5.0V and 0V, and the operating voltage VDD_ADC supplied to the ADC 13 is the potential difference between the node VA and the node VB, VDD_ADC=VA−VB=5.0V . . . (4-9).

Thus, when the cell selected by the multiplexer 11 is the cell VC_1 on the lowest potential side of the battery 2, the power supply circuit 12 cannot make the reference of the operating voltage supplied to the ADC 13 to 1.0 V, which is the midpoint of the high and low potentials of the cell VC_1.

However, the power supply circuit 12 can output the low potential of the cell VC_1 as the low potential of the operating voltage VDD_ADC from the node VB. In addition, the power supply circuit 12 can output the potential that takes into account the voltage rise of the resistors R3 to R5 from the node VB as the high potential of the operating voltage VDD_ADC from the node VA.

As a result, 5.0 V can be supplied to the ADC 13 as the operating voltage VDD_ADC. Here, the width of the operating voltage VDD_ADC, which is the potential difference that determines the high and low of the digital signal waveform, can be 5.0 V, the same as Case 1 to Case 3.

Even if the selected cell is not the lowest potential side cell VC_1, if equation (4-10) is satisfied, the power supply circuit 12 generates the voltage from equation (4-7) to equation (4-9): Vcom−Vr5<V_0 . . . (4-10)

Also, the reference voltage Vref is the multiplier that determines the width of the operating voltage VDD_ADC (difference between the highest and lowest potentials). The width of the operating voltage VDD_ADC can be changed by changing the resistance ratio of the resistors R5 to R3. For example, if R5:R4:R3=2:1:1, the result of equations (4-2) and (4-3) is 2.0 V, respectively, and the width of VDD_ADC is 4.0 V.

The remaining battery capacity Vcell_1 of the cell VC_N is converted to a digital signal by the ADC 13. This digital signal is converted to a digital signal whose low level is VSS (=0V) by the digital level shifter 31. At this time, the digital level shifter 31 can also work noise removal, such as excluding obviously abnormal data, or change the width of the digital signal (difference between the high and low levels).

Thus, even when the cell VC_1 on the lowest potential side is selected, the power supply circuit 12 can bring the operating voltage VDD_ADC within the operable range of the ADC 13 under the same conditions A to C as in Cases 1 to 3.

Although the present disclosure has been described above based on the embodiments, the present disclosure is not limited to the above embodiments. Various variations and improvements, such as combination with or replacement of some or all of the other embodiments, are possible within the scope of the invention. For example, a transistor can be used as a resistive element. For example, the power supply circuit may be attached to the target product without being built into the power supply device.

According to an aspect of the present disclosure, there is provided a power supply monitoring circuit including: a first terminal to which a first voltage that is a highest voltage of a battery including a number of cells is connected, the number being an integer greater than or equal to two; a second terminal to which a second voltage that is a lowest voltage of the battery is connected; a selection circuit that selects a high potential and a low potential of a cell which is one of the number of cells; an analog-to-digital conversion circuit to which the high potential and the low potential are input; a power supply circuit that generates an operating voltage of the analog-to-digital conversion circuit; and a logic circuit that receives a signal from the analog-to-digital conversion circuit, processes the signal, and outputs a signal from a third terminal to an external device, wherein the operating voltage is a first operating voltage with a midpoint of the high potential and the low potential as a reference.

With this configuration, it is possible to simplify the configuration of the power supply circuit, and the voltage monitoring circuit and the power supply device having the power supply circuit by generating the operating voltage of the ADC with the midpoint of the high and low potentials of the cell to be measured as a reference.

Although some embodiments of the present invention have been described and illustrated in detail, the disclosed embodiments are made for purposes of not limitation but illustration and example only. The scope of the present invention should be interpreted by terms of the appended claims.

The invention claimed is:

1. A power supply monitoring circuit, comprising:

a first terminal to which a first voltage that is a highest voltage of a battery including a number of cells is connected, the number of cells being an integer greater than or equal to two;

a second terminal to which a second voltage that is a lowest voltage of the battery is connected;

a selection circuit that selects a high potential and a low potential of a cell which is one of the number of cells;

an analog-to-digital conversion circuit to which the high potential and the low potential are input;

a power supply circuit that generates an operating voltage of the analog-to-digital conversion circuit; and a logic circuit that receives a first signal from the analog-to-digital conversion circuit, processes the first signal, and outputs a second signal from a third terminal to an external device, wherein the operating voltage is a first operating voltage with a midpoint of the high potential and the low potential as a reference.

2. The power supply monitoring circuit according to claim 1, wherein:

the operating voltage is a second operating voltage with a high potential of the operating voltage as the first voltage, for the cell that is selected by the selection circuit and on a highest potential side of the battery, and the operating voltage is a third operating voltage with a low potential of the operating voltage as the second voltage, for the cell that is selected by the selection circuit and on a lowest potential side of the battery.

3. The power supply monitoring circuit according to claim 1, wherein;

the power supply circuit includes a first differential amplifier, a first resistor circuit electrically connected between the high potential and the low potential, and a second resistor circuit electrically connected between the first terminal and the second terminal, and the midpoint is a third voltage divided by the first resistor circuit, and a fourth voltage divided by the second resistor circuit and a voltage based on a fifth voltage are input to the first differential amplifier.

4. The power supply monitoring circuit according to claim 3, further comprising a second differential amplifier to which the third voltage and a sixth voltage are input, and output of which is input to the first differential amplifier, wherein:

the first resistor circuit includes a first resistor and a second resistor connected in series in order from a high potential side, the second resistor circuit includes a third resistor, a fourth resistor, and a fifth resistor connected in series in order from a first terminal side, the third voltage is a voltage at a connection point of the first resistor and the second resistor, the fourth voltage is a voltage at a connection point of the fourth resistor and the fifth resistor, the fifth voltage is a voltage on a low potential side of the fifth resistor, and the sixth voltage is a voltage at a connection point of the third resistor and the fourth resistor.

5. The power supply monitoring circuit according to claim 3, wherein;

the power supply circuit includes a first transistor located on a high potential side of the second resistor circuit and a second transistor located on a low potential side of the second resistor circuit, and the first differential amplifier controls the first transistor and the second transistor, and outputs a voltage of a drain of the first transistor and a drain of the second transistor as the operating voltage.

6. A power supply device, comprising:

a battery including a number of cells, the number of cells being an integer greater than or equal to two;

a selection circuit that selects a high potential and a low potential of a cell which is one of the number of cells;

an analog-to-digital conversion circuit to which the high potential and the low potential are input;

a power supply circuit that generates an operating voltage of the analog-to-digital conversion circuit; and a logic circuit that receives a signal from the analog-to-digital conversion circuit and processes the signal, wherein the operating voltage is a first operating voltage with a midpoint of the high potential and the low potential as a reference.

7. The power supply device according to claim 6, wherein:

the operating voltage is a second operating voltage with a high potential of the operating voltage as a highest potential of the battery, for the cell that is selected by the selection circuit and on a highest potential side of the battery, and the operating voltage is a third operating voltage with a low potential of the operating voltage as a lowest potential of the battery, for the cell that is selected by the selection circuit and on a lowest potential side of the battery.

8. A power supply circuit, comprising:

a first node to which a first voltage that is a highest voltage of a battery including a number of cells is connected, the number of cells being an integer greater than or equal to two;

a second node to which a second voltage that is a lowest voltage of the battery is connected;

a third node to which a high potential of one cell selected from among the number of cells is input; and a fourth node to which a low potential of the selected one cell is input, wherein a first operating voltage with a midpoint of the high potential and the low potential as a reference is generated as an operating voltage of an analog-to-digital conversion circuit.

9. The power supply circuit according to claim 8, wherein:

the operating voltage is a second operating voltage with a high potential of the operating voltage as the first voltage, for the third node that is a high potential of a cell on a highest potential side of the battery, and the operating voltage is a third operating voltage with a low potential of the operating voltage as the second voltage, for the fourth node that is a low potential of a cell on a lowest potential side of the battery.

10. The power supply circuit according to claim 8, further comprising:

a first differential amplifier;

a first resistor circuit electrically connected between the third node and the fourth node; and a second resistor circuit electrically connected between the first node and the second node, wherein the midpoint is a third voltage divided by the first resistor circuit, and a fourth voltage divided by the second resistor circuit and a voltage based on a fifth voltage divided by the second resistor circuit are input to the first differential amplifier.

11. The power supply circuit according to claim 10, further comprising a second differential amplifier to which the third voltage and a sixth voltage are input, and output of which is input to the first differential amplifier, wherein:

the first resistor circuit includes a first resistor and a second resistor connected in series in order from a third node side, the second resistor circuit includes a third resistor, a fourth resistor, and a fifth resistor connected in series in order from a first node side, the third voltage is a voltage at a connection point of the first resistor and the second resistor, the fourth voltage is a voltage at a connection point of the fourth resistor and the fifth resistor, the fifth voltage is a voltage on a low potential side of the fifth resistor, and the sixth voltage is a voltage at a connection point of the third resistor and the fourth resistor.

12. The power supply circuit according to claim 10, further comprising:

a first transistor located on a high potential side of the second resistor circuit; and a second transistor located on a low potential side of the second resistor circuit, wherein the first differential amplifier controls the first transistor and the second transistor, and outputs a voltage of a drain of the first transistor and a drain of the second transistor as the operating voltage.

13. The power supply circuit according to claim 8, wherein the power supply circuit is configured to generate the first operating voltage with the midpoint of the high potential and the low potential as the reference, as the operating voltage of the analog-to-digital conversion circuit, according to a change in the high potential and the low potential.

* * * * *